United States Patent

Streit

Patent Number: 5,644,149
Date of Patent: Jul. 1, 1997

[54] ANODE-SIDE SHORT STRUCTURE FOR ASYMMETRIC THYRISTORS

[75] Inventor: Peter Streit, Widen, Switzerland

[73] Assignee: Asea Brown Boveri AG, Baden, Switzerland

[21] Appl. No.: 406,060

[22] Filed: Mar. 17, 1995

[30] Foreign Application Priority Data

Jun. 10, 1994 [DE] Germany ............... 44 20 252.0

[51] Int. Cl.$^6$ .................. H01L 29/74; H01L 31/111
[52] U.S. Cl. ............ 257/147; 257/142; 257/143; 257/144; 257/149
[58] Field of Search ............... 257/138, 142, 257/143, 144, 147, 149, 152

[56] References Cited

U.S. PATENT DOCUMENTS

| 4,742,382 | 5/1988 | Jaecklin | 257/147 |
| 5,491,351 | 2/1996 | Bauer et al. | 257/152 |

FOREIGN PATENT DOCUMENTS

| 0327901 | 8/1989 | European Pat. Off. . | |
| 0345435 | 12/1989 | European Pat. Off. . | |
| 2906721 | 9/1979 | Germany | 257/147 |
| 62-26857 | 2/1987 | Japan . | |

OTHER PUBLICATIONS

Tsunedo, Ogura, et al.: 6000–V Gate Turn–Off Thyristors (GTO's) with n–Buffer and New Anode Short Structure. In: IEEE Transactions on Electron Devices, vol. 38, No. 6, Jun., 1991, pp. 1491–1496.

Mitsuru, Kekura, et al.: 8000–V 1000–A Gate Turn–Off Thyristor with Low On–State Voltage and Lo Switching Loss. In: IEEE Transactions on Power Electronics, vol. 5, No. 4, Oct., 1990, pp. 430–435.

*Primary Examiner*—Sara W. Crane
*Assistant Examiner*—Fetsum Abraham
*Attorney, Agent, or Firm*—Oblon, Spivak, McClelland, Maier & Neustadt, P.C.

[57] ABSTRACT

A thyristor according to the invention comprises a layer sequence containing an n-type emitter layer (4), a p-type base layer (5), an n-type base layer (6) and a p-type emitter layer (7) in a semiconductor substrate (3) between an anode (1) and a cathode (2). The p-type emitter layer (7) is perforated by anode short-circuit zones (8) and is thereby subdivided into sections. In this arrangement, the anode short circuits (8) short-circuit the n-type base layer (6) to the anode (1). Disposed between the anode short circuits (8) and the p-type emitter layer (7) is a p-type barrier layer (9), also referred to as p-type soft layer. According to the invention, said p-type barrier layer (9) has gaps (12) in which the n-type base (6) is contacted by the anode (1) either directly or via an anode short circuit (8).

12 Claims, 3 Drawing Sheets 5,644,149

ANODE-SIDE SHORT STRUCTURE FOR ASYMMETRIC THYRISTORS

BACKGROUND OF THE INVENTION

1. Field of the Invention

The invention relates to the field of power semiconductor electronics.

It proceeds from a thyristor in accordance with the preamble of the first claim.

2. Discussion of Background

Such a thyristor has already been described in European Patent Application EP 0 327 901 A1.

This is an asymmetrically blocking thyristor, that is to say a thyristor which has only a forward-blocking and a forward-conducting operating state. A reverse-blocking state is not required, but the necessary reverse-conducting state is achieved by means of a discrete or integrated antiparallel diode.

Because of the absence of reverse-blocking capability, such asymmetrically blocking components have some additional degrees of freedom in terms of design which make a different optimization possible. The most important possibilities for improvement are:

a) the introduction of a stop layer for the purpose of a thinner wafer design.

b) the introduction of anode-side shorting for improving the dynamic characteristics.

Both measures have a great potential for improvement, the stop layer primarily at very high voltages (for example, above 3 kV), the anode shorting primarily in the case of gate-turn-off high-power components, so-called GTOs, since the sweeping of charge carriers out of the anode-side regions is markedly facilitated in these components and the tail current is consequently reduced.

However, both measures have also certain disadvantages in relation to turn-on and on state since the effectiveness of the anode-side emitter is influenced. In the case of the stop layer, this influence is only very slight and gradual, but in the case of the shorting, it is much stronger since an actual triggering threshold is introduced. A combination of both measures in the same component has the strongest triggering-inhibiting action.

It is interesting that this opposing influencing of triggering and turn-off optimization manifests itself not only in relation to the presence of anode shorting but also in relation to the design of said shorting: the optimization of the turn-off behavior requires per se as fine-mesh shorting as possible in which the emitter and short regions are distributed as uniformly as possible over the entire active component surface, whereas the triggerability suffers to the extent that the minimum emitter width is reduced.

The design of the structure of a conventional shorted anode is accordingly an optimization problem in which it is a matter of having the best possible influence on the turn-off characteristics without, at the same time, impairing the readiness of the components to trigger in a way prohibited by specifications or a way which is no longer controllable by gate units.

The shorting action during turn-off is crucial especially at high injection in the n-type base, whereas the behavior of the anode emitter is important for the triggerability at low to medium injection. In the patent application EP 0 327 901 A1 mentioned, an attempt is therefore made to introduce other structures of lower dopant concentration in front of the actual emitter structure as active at high injection, which structures of lower dopant concentration markedly influence the characteristics at low injection. For this purpose, a lightly doped p-type barrier layer is introduced in front of the anode short circuits.

This has the consequence that the typical triggering threshold for the shorted anode, i.e. the defined anode current density at and above which hole emission can take place from the anode, becomes virtually ineffective. Consequently, the components are generally very much more readily triggerable. This measure, however, also has disadvantageous side effects:

In the case of GTOs which do not have cathode-side shorting, the anode-side definition of a triggering threshold is also lost with the lightly doped barrier layer, i.e. especially at elevated temperatures, the components may become so readily-triggerable that the voltage-sustaining capability (dV/dt strength) is put at risk.

In itself, a barrier layer over the entire surface intensifies the leakage currents in the component.

The barrier layer results in a reverse-voltage behavior which is not actually defined since the p-n junction additionally introduced has a certain blocking capability and accordingly breaks down at a poorly defined voltage.

SUMMARY OF THE INVENTION

Accordingly, one object of the invention is to provide a novel thyristor which has an adequate voltage-sustaining capability even at elevated temperatures and in which the abovementioned disadvantages are avoided. In particular, the thyristor according to the invention is intended to have a good shorting effectiveness accompanied by triggerability which is nevertheless good.

This object is achieved by the features of the first claim.

The essence of the invention is therefore that the actions of the anode short circuits and barrier layer are largely decoupled by a lateral structuring of the barrier layer. It is consequently possible both to eliminate the two abovementioned disadvantages and also to define a new triggering threshold which is not directly coupled to the shorting effectiveness during turn-off.

For this purpose, the barrier layer has gaps in which the n-type base is contacted by the anode directly or via an anode short-circuit zone.

In an exemplary embodiment, a continuous n-type stop layer is additionally inserted in front of the p-type barrier layer. The gaps are, in particular, either of strip-type or hole-type design.

Further exemplary embodiments emerge from the corresponding dependent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

The reference numerals used in the drawings and their meaning are listed in tabular form in the list of designations. In the Figures, identical parts are always provided with identical reference numerals.

DESCRIPTION OF THE PREFERRED EMBODIMENTS

Characteristic of a conventional shorted anode structure is that the short regions are connected directly (without junction) to the n-type base. At low current density, it is clear that the charge carriers avoid the potential barrier of the p-n junction to the $p^+$-type emitter and therefore drain directly into the shorts so that, initially, no hole injection can occur at the anode and the thyristor does not latch but conducts purely as an n-p-n transistor. Only when lateral currents in front of the emitter regions are sufficiently high is there a triggering threshold at and above which the voltage drop is sufficient for hole injection and a bipolar conduction state consequently arises. In the language of the two-transistor equivalent circuit diagram, this world mean that the p-n-p transistor has a current gain $\alpha$ (common-base circuit) which is different from zero only at and above said triggering threshold.

With increasing current density, said $\alpha$ (p-n-p) then increases relatively steeply so as to tend to a saturation value which is now essentially limited, in turn, by the emitter-to-total-anode area ratio, on which, however, the fineness of the structure is hardly dependent. This argumentation therefore suggests that it is possible to adjust two parameters which are important for the electrical behavior within certain limits independently of one another by means of a suitable short structure:

a) a threshold current density at and above which hole injection by the anode commences, and b) a saturation value of $\alpha$ (p-n-p) which is not exceeded even in the high-injection case.

Figure 1:
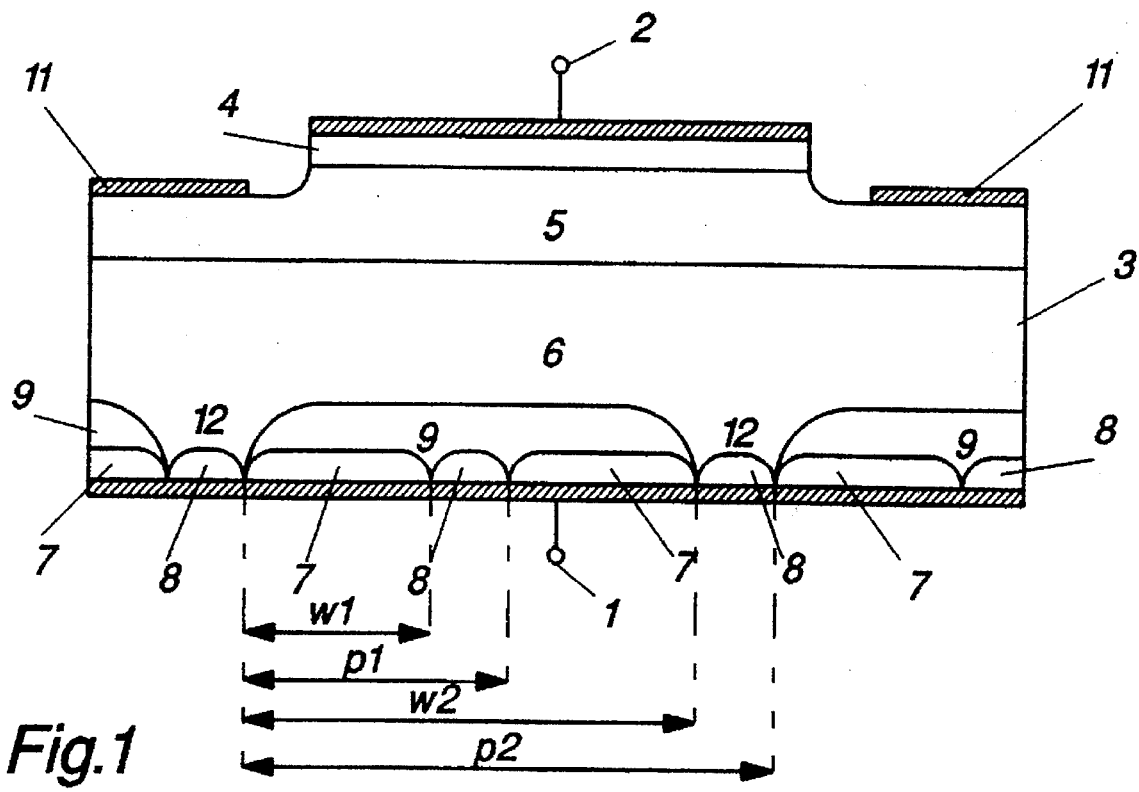
FIG. 1 shows a portion of a thyristor according to the invention.

In the case of a structure with inserted, relatively lightly doped p-type barrier layer (also referred to below as "p-type soft layer") as in EP 0 327 901 A1, the occurrence of lateral currents in the n-type base is largely prevented. The triggering threshold consequently becomes inoperative. If, however, the concentrations in the p-type soft layer are not high enough to result in lateral currents on their part or to inject into the n-type base, the area ratio of the emitter and short structure situated behind them is decisive for the high-injection case. Consequently, the positive action of the shorting in relation to the switching behavior continues to be ensured to approximately the same extent. Or, in the context of EP 0 327 901 A1, it now becomes possible to design the anode shorting in a markedly more fine-mesh manner and, consequently, in a more effective manner during turn-off without at the same time having to continue to take account of the requirements imposed on the readiness of the components to trigger. On the other hand, the use of a p-type barrier layer is associated with the disadvantages already explained at the outset, and these can be eliminated by the invention in the following way:

FIG. 1 shows a first embodiment of the present invention. A p-type barrier layer (9), which is also laterally structured, is shown, and in this simple example, both structures have their smallest dimensions in the same plane. The conventional emitter structure (7) is characterized by the parameters w1 and p1 while the p-type soft barrier-layer structure (9) has the analogous parameters w2 and p2 but with higher chosen values. In this simple case, it is important that p2 is a multiple of p1 and the shorts (8) in the array 2 coincide with those in the array 1. In the case of this structure, it is clear that, as the width of the p-type soft structure (9) w2 (in addition to the conductivity of the n-type base) determines the triggering threshold in an analogous way to the width w of the p-type emitter of a GTO in accordance with the prior art. Consequently, a triggering threshold defined by the structure can therefore furthermore be achieved without the actual emitter structure (7) having to be made coarse and ineffective.

It is likewise clear that this double structure has no parasitic reverse-blocking capability because of the coinciding shorts (8) and that the low reverse currents in the component also drain unhindered into the shorts (8) and are therefore not amplified further by the p-n-p transistor. Consequently, all the disadvantages, mentioned at the outset, of a conventional p-type barrier layer (9) are eliminated.

Figure 6:
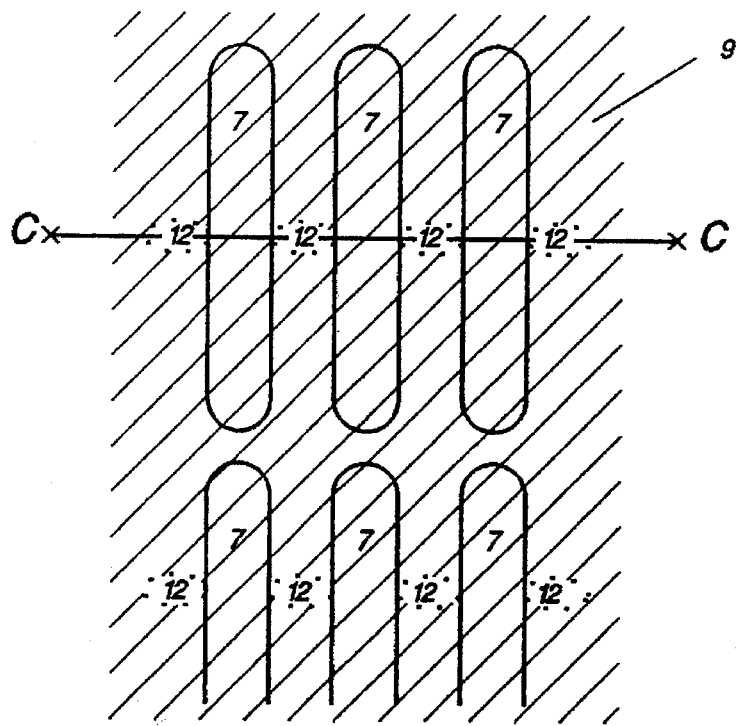

A thyristor according to the invention therefore comprises a layer sequence containing an n-type emitter layer (4), a p-type base layer (5), an n-type base layer (6) and a p-type emitter layer (7) in a semiconductor substrate (3) between an anode (1) and a cathode (2). The p-type emitter layer (7) is perforated by anode short-circuit zones (8) and is thereby subdivided into sections. In this arrangement, the anode short circuits (8) short-circuit the n-type base layer (6) to the anode (1). Disposed between the anode short circuits (8) and the p-type emitter layer (7) is a p-type barrier layer (9), also referred to as p-type soft layer. According to the invention, said p-type barrier layer (9) is also subdivided into sections which are bounded on both sides by anode short-circuit zones (8). The width of the sections of the p-type barrier layer (9) is now chosen to be at least twice as large as that of the sections of the p-type emitter layer (7). The p-type barrier layer (9) therefore has gaps (12) in which the n-type base (6) is contacted by the anode (1) either directly or via an anode short circuit (8). If such a structure of the p-type barrier layer (9) is viewed from above, a plan view as shown in FIG. 6, for example, emerges. It should be noted that the anode short-circuit zones (8) are not shown and the emitter zones (7) have been chosen to be equally as wide as the gaps (12). If FIG. 6 is sectioned along the line C—C, FIG. 1 essentially results.

Figure 2:
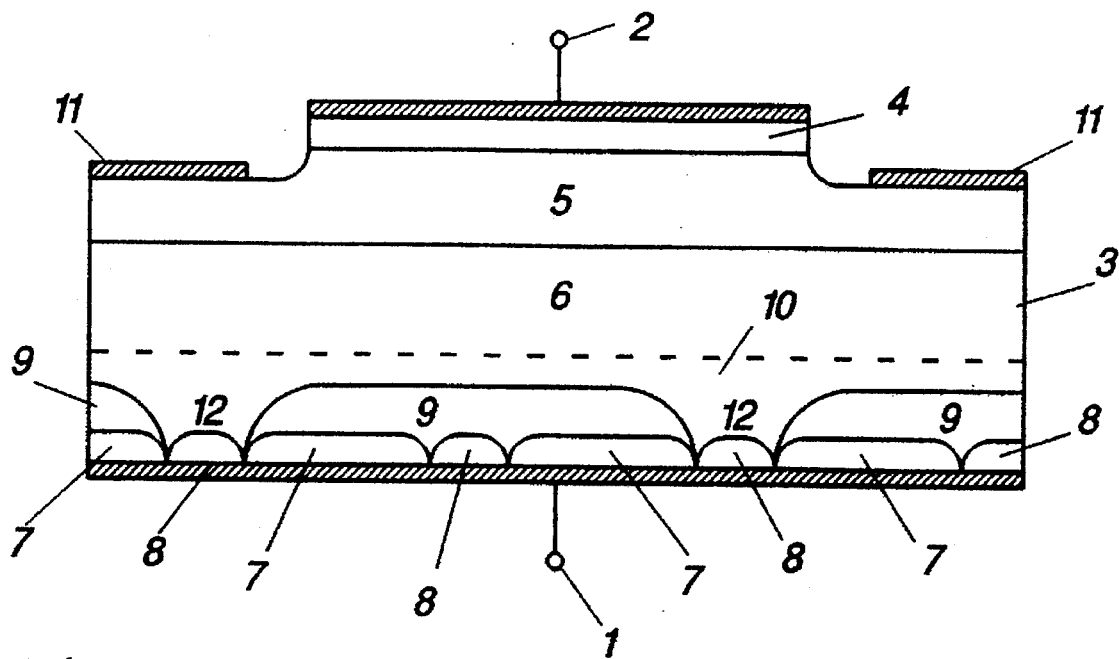
FIG. 2 shows a portion of a thyristor according to the invention in a variant having an additional stop layer.

FIG. 2 shows a similar structure to that in FIG. 1, but in this case a further diffused n-stop layer (10) is inserted in front of the p-type soft structure (9), said stop layer being similar to that described in the introduction as typical for asymmetric components: the stop layer (10). Such stop layers (10) have a markedly increased donor concentration compared with the n-type base (6) so that a reduction in the component thickness becomes possible. The conductivity per unit area therefore also increases and, consequently, the short effectiveness increases to an unintended extent. It is therefore hardly possible to combine conventional short structures (8) with stop layers (10) since either untriggerable components result or the structures become so coarse that a homogeneous action cannot establish itself during turn-off.

This difficulty is largely resolved by the above p-type barrier layer (9) since it is now possible to deploy it over a much larger area without the emitter structure (7) becoming ineffective. A certain inhomogeneity of the triggering is much more permissible since, in this case, the lateral plasma propagation inside the individual cathode/emitter regions (4) results very rapidly in homogeneous current distribution.

Figure 3:
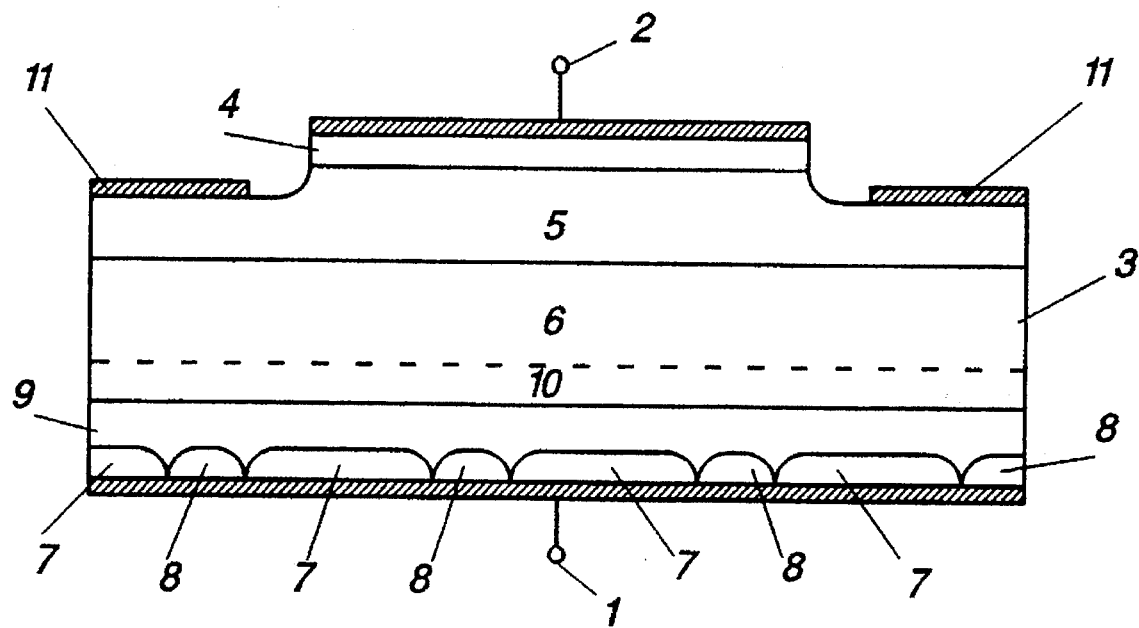
FIGS. 3, 4 show further sections through a thyristor according to the invention.
Figure 4:
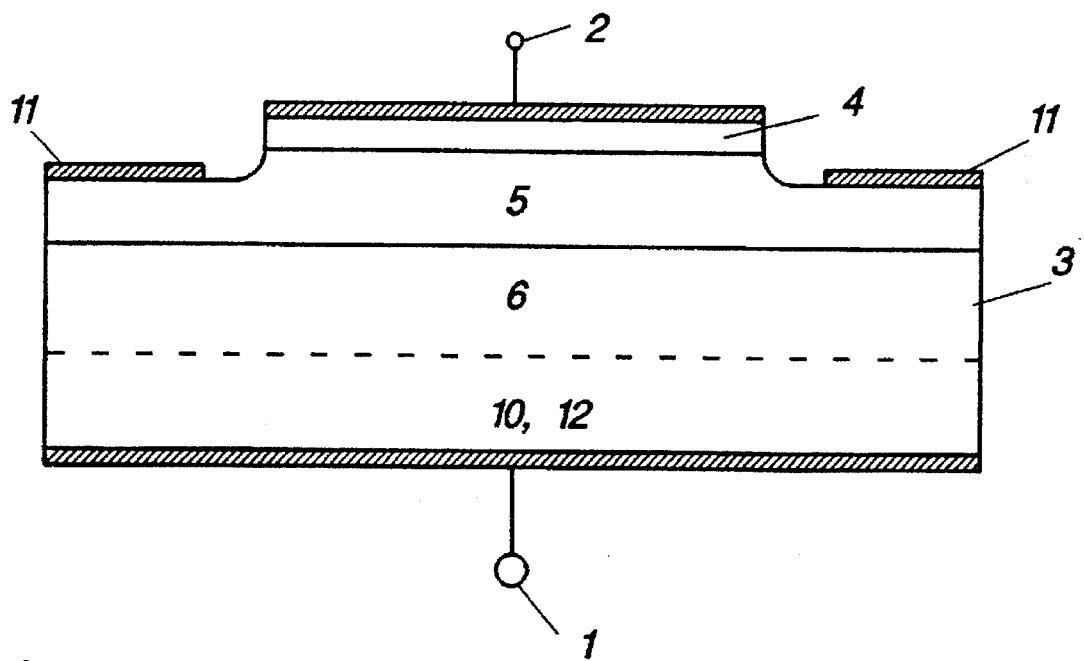
Figure 5:
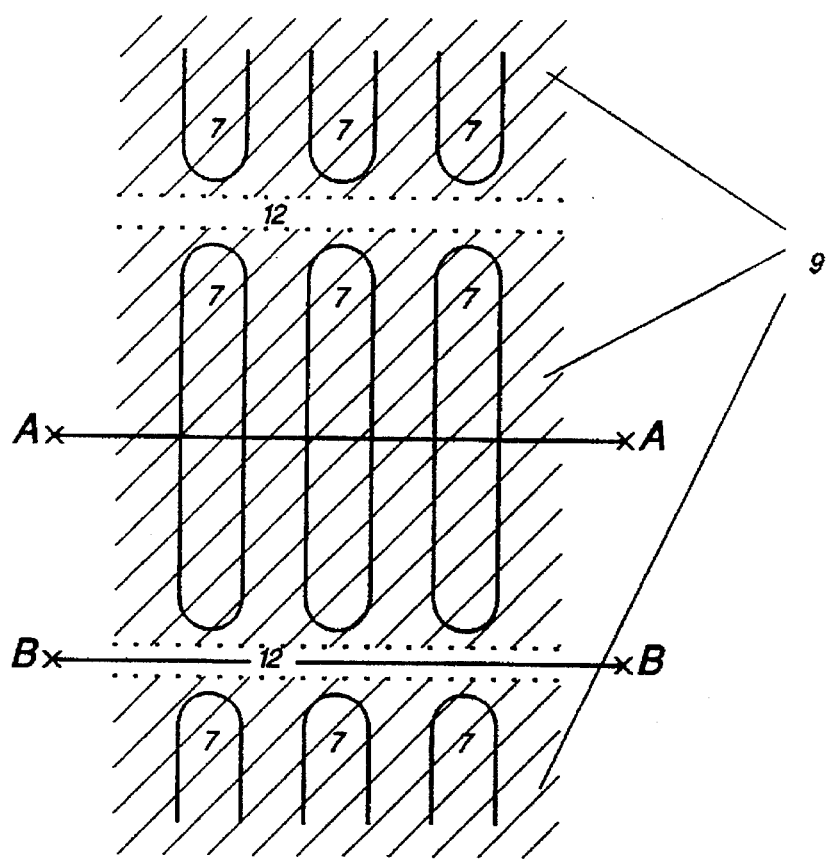
FIGS. 5, 6 show diagrammatic plan views of the p-type barrier layer according to the invention.

Quite generally, the gaps (12) can be, for example, of strip-type design, as in FIG. 5, or of hole-type design, as in FIG. 6. If, in addition, finger-type p-type emitter zones (7)

are provided, the hole-type gaps (12) may be disposed either at the ends or essentially in the centre. In this way, readily triggerable finger centres or finger ends are obtained. Furthermore, the strip-type gaps (12) may be disposed either parallel to or at right angles to the p-type emitter zones (7). In the case of a right-angled arrangement, for example as in FIG. 5, the sectional views of FIGS. 3 and 4 result. FIG. 3 corresponds to a section along the line A—A, FIG. 4 to one along B—B.

All in all, the structure according to the invention results in a thyristor in which the action of anode short circuits (8) and of a barrier layer (9) can be substantially decoupled. Consequently, both measures can be optimized separately so that their advantages come to full fruition.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A gate-turn-off, asymmetrically blocking thyristor having an anode and a cathode, comprising
   a) a layer sequence of an n-type emitter layer, a p-type base layer, an n-type base layer and a p-type emitter layer in a semiconductor substrate between the anode and the cathode,
   b) the p-type emitter layer being perforated by anode short circuits and
   c) a p-type barrier layer being disposed between the anode short circuits or the p-type emitter layer, wherein
   d) the p-type barrier layer has gaps in which the n-type base is contacted by the anode directly or via an anode short circuit.

2. The thyristor as claimed in claim 1, wherein an n-type stop layer over the entire surface is disposed between the n-type base and the p-type barrier layer.

3. The thyristor as claimed in claim 2, wherein the gaps are of strip-type design.

4. The thyristor as claimed in claim 3, wherein the spacing between two strip-type gaps is at least twice as great as the distance between two anode short circuits.

5. The thyristor as claimed in claim 2, wherein the gaps are designed as holes in the p-type barrier layer.

6. The thyristor as claimed in claim 5, wherein the p-type emitter layer is subdivided into finger-type sections and the hole-type gaps are disposed essentially in the centre of the fingers.

7. The thyristor as claimed in claim 5, wherein the hole-type gaps are disposed at the ends of the fingers.

8. The thyristor as claimed in claim 1, wherein the gaps are of strip-type design.

9. The thyristor as claimed in claim 8, wherein the spacing between two strip-type gaps is at least twice as great as the distance between two anode short circuits.

10. The thyristor as claimed in claim 1, wherein the gaps are designed as holes in the p-type barrier layer.

11. The thyristor as claimed in claim 10 wherein the p-type emitter layer is subdivided into finger-type sections and the hole-type gaps are disposed essentially in the centre of the fingers.

12. The thyristor as claimed in claim 10, wherein the hole-type gaps are disposed at the ends of the fingers.

* * * * *